United States Patent
Blanchard

(10) Patent No.: US 6,584,365 B1
(45) Date of Patent: Jun. 24, 2003

(54) ELECTRONIC TRIP DEVICE WITH OFFSET CORRECTION MEANS

(75) Inventor: Pierre Blanchard, Voreppe (FR)

(73) Assignee: Square D Company, Palatine, IL (US)

( * ) Notice: Subject to any disclaimer, the term of this patent is extended or adjusted under 35 U.S.C. 154(b) by 418 days.

(21) Appl. No.: 09/625,499

(22) Filed: Jul. 26, 2000

(30) Foreign Application Priority Data

Sep. 15, 1999 (FR) .............................................. 99 11692

(51) Int. Cl.$^7$ .............................................. G05B 11/01
(52) U.S. Cl. ................................ 700/12; 700/6; 700/7; 700/11; 700/13; 700/14; 700/52; 341/118; 341/122; 341/155; 341/156; 341/131; 341/158; 327/65; 327/91; 330/9
(58) Field of Search ........................... 700/6, 7, 11, 12, 700/13, 14, 30, 31, 34–35, 39, 51, 55, 73–75; 341/118–122, 155–156, 161, 131, 144, 139, 158; 327/65, 91; 330/9

(56) References Cited

U.S. PATENT DOCUMENTS

| | | | | |
|---|---|---|---|---|
| 4,338,589 A | * | 7/1982 | Engel et al. ................. | 341/120 |
| 4,380,005 A | * | 4/1983 | Debord et al. ............... | 341/118 |
| 4,417,160 A | * | 11/1983 | Schade, Jr. ................... | 327/95 |
| 4,566,110 A | * | 1/1986 | Kolber ......................... | 377/10 |
| 4,590,458 A | * | 5/1986 | Evans et al. ................. | 341/118 |
| 4,792,916 A | | 12/1988 | Benestad ................. | 364/724.17 |
| 4,803,462 A | * | 2/1989 | Hester et al. ................ | 341/172 |
| 4,833,445 A | * | 5/1989 | Buchele ....................... | 341/118 |
| 4,908,621 A | * | 3/1990 | Polonio et al. .............. | 341/120 |
| 4,972,189 A | * | 11/1990 | Polito et al. ................. | 341/118 |
| 5,014,056 A | * | 5/1991 | Moriwaki ..................... | 341/161 |
| 5,182,476 A | * | 1/1993 | Hanna et al. ................. | 327/362 |
| 5,208,545 A | | 5/1993 | Schweitzer, III ............. | 328/151 |
| 5,214,430 A | * | 5/1993 | Gulczynski .................. | 341/120 |
| 5,561,660 A | * | 10/1996 | Kotowski et al. ........... | 370/215 |
| 5,929,796 A | * | 7/1999 | Opris et al. .................. | 341/120 |
| 6,057,891 A | * | 5/2000 | Guerin et al. ................ | 348/572 |
| 6,134,282 A | * | 10/2000 | Ben-Efraim et al. ........ | 375/350 |
| 6,181,099 B1 | * | 1/2001 | Bixel et al. .................. | 318/610 |
| 6,285,292 B1 | * | 9/2001 | Suptitz et al. ............... | 340/657 |
| 6,304,208 B1 | * | 10/2001 | Nagashima .................. | 341/172 |
| 6,437,952 B1 | * | 8/2002 | Suptitz et al. ................. | 361/42 |

FOREIGN PATENT DOCUMENTS

EP 0 512 480 A2 11/1992

OTHER PUBLICATIONS

Patent Abstracts of Japan, vol. 1998, No. 06, Apr. 30, 1998 & JP 10 041985 A (Toyo Commun Equip. Co. Ltd) Nov. 11, 1992 Abstract.

* cited by examiner

*Primary Examiner*—Ramesh Patel
(74) *Attorney, Agent, or Firm*—Parkhurst & Wendel, L.L.P.

(57) ABSTRACT

An electronic trip device including an analog measuring for measuring electrical signals, analog-to-digital conversion having an input connected to the analog measuring an output having a first output signal, a digital processing means connected to the conversion for performing protection functions, and an offset correction. The offset corrections means are connected to the output of the conversion, and include high-pass digital filtering for computing an output signal value for each sample signal supplied by the conversion, according to an equation.

3 Claims, 4 Drawing Sheets

ELECTRONIC TRIP DEVICE WITH OFFSET CORRECTION MEANS

BACKGROUND OF THE INVENTION

The invention relates to an electronic trip device comprising analog measuring means for measuring electrical signals, analog-to-digital conversion means having an input connected to the analog measuring means, digital processing means connected to the conversion means and performing protection functions, and offset correction means.

Numerous offset correction devices are known, in particular in measurement of AC electrical signals. In U.S. Pat. No. 5,060,166, for example, the digital processing circuit of a measuring device uses pair of samples which are 90° apart to perform offset correction digitally. This type of correction is complex in so far as it requires the sampling period to be linked to the frequency of the signal to be measured and four successive sample values to be stored in memory.

In other known devices, each measurement sample is associated to an offset measurement, by periodic zero resetting, at the sampling frequency, of the input of the analog measuring channel, upstream from the analog-to-digital converter. For each sample, the processing circuit subtracts the value of the measured offset from the value of the sample. This type of correction slows conversion down as, for each sample, the analog-to-digital converter has to convert both the sample and the associated offset value.

OBJECT OF THE INVENTION

The object of the invention is to achieve an offset correction more particularly suited for use in an electronic trip device and not presenting the drawbacks of known correction devices.

According to the invention, this object is achieved by the fact that the offset correction means comprise digital filtering means of the high-pass type, in the digital processing means on output from the conversion means, and means for initialization of the digital filtering means performing, during an initialization phase, grounding of the input of the conversion means, storing of the output signal from the conversion means and zero resetting of the corresponding output value of the digital filtering means.

According to a development of the invention the digital filtering means perform computation of an output value $S_i$ for each sample $E_i$ supplied by the conversion means, according to the equation:

$$S_i = S_{i-1} - \alpha S_{i-1} + E_i - E_{i-1}$$

in which i corresponds to the rank of the sample considered, $\alpha$ is a constant, which is a function of a sampling period of the signals to be measured and of a cutoff frequency of the digital filtering means, $S_0=0$ and $E_0$ is the value of the output signal from the conversion means obtained when initialization is performed.

The trip device can comprise a plurality of analog measuring channels whose outputs are connected to a multiplexer, connected to conversion means common to all the measuring channels, the digital processing means controlling the multiplexer to reset the input of the conversion means to zero during the initialization phase.

BRIEF DESCRIPTION OF THE DRAWINGS

Other advantages and features of the invention will become more clearly apparent from the following description of particular embodiments of the invention given as non-restrictive examples only and represented in the accompanying drawings in which:

FIG. 5 illustrates the curves E and S of FIG. 2 in greater detail at the moment the trip device is powered on.

DETAILED DESCRIPTION OF THE PREFERRED EMBODIMENT

Figure 1:
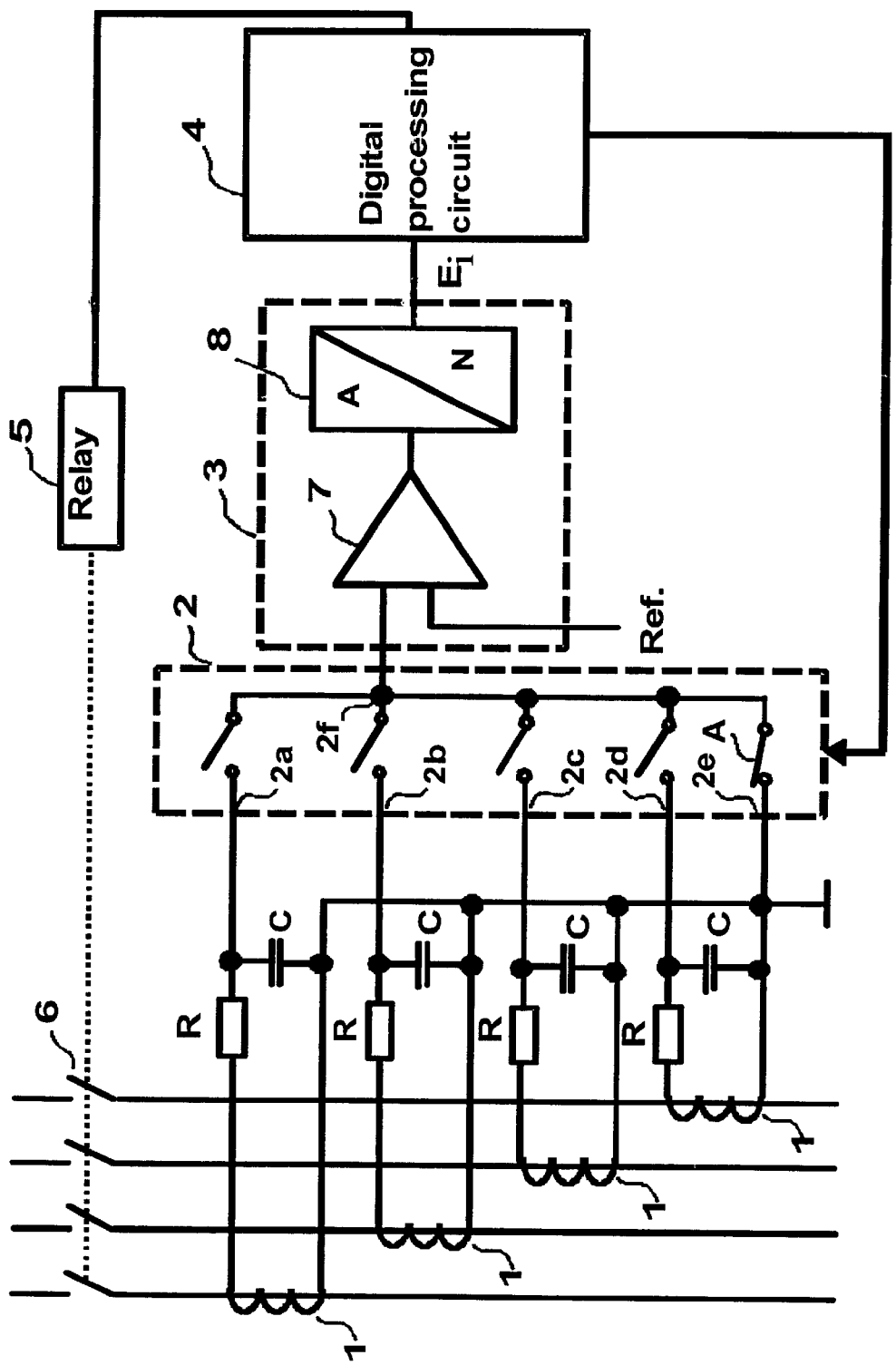
FIG. 1 represents, in block diagram form, an electronic trip device according to the invention, in the initialization phase.

The electronic trip device according to FIG. 1 is designed for protection of a three-phase plus neutral electrical power system. A current transformer is associated to each of the phase conductors and to the neutral conductor of the power system. In the particular embodiment represented in FIG. 1, the current transformers 1 are formed by Rogowski coils supplying signals representative of the derivative of the current to be measured. In FIG. 1, four analog measuring channels are represented each comprising an RC type integrating circuit connected in parallel on the secondary winding of the corresponding current transformer. One of the ends of each secondary winding is grounded. The outputs of the integrators are connected to corresponding inputs of a multiplexer 2 designed to selectively connect the output of one of the analog channels to the input of an analog-to-digital conversion circuit 3.

The output of the analog-to-digital conversion circuit 3 is connected to an input of a digital processing circuit 4 which performs various protection functions, for example of the long delay or short delay type, and causes opening of the contacts 6 of a circuit breaker by means of a relay 5 in the event of an overload and/or a short-circuit. The digital processing circuit 4 also controls the multiplexer 2.

In the embodiment represented in FIG. 1, the analog-to-digital conversion circuit 3 comprises, in series, an amplifier 7 and an analog-to-digital converter 8. It supplies the digital processing circuit 4 with an input signal E representative of the measured current I (FIG. 2) in the form of successive digital samples $E_i$.

Figure 3:
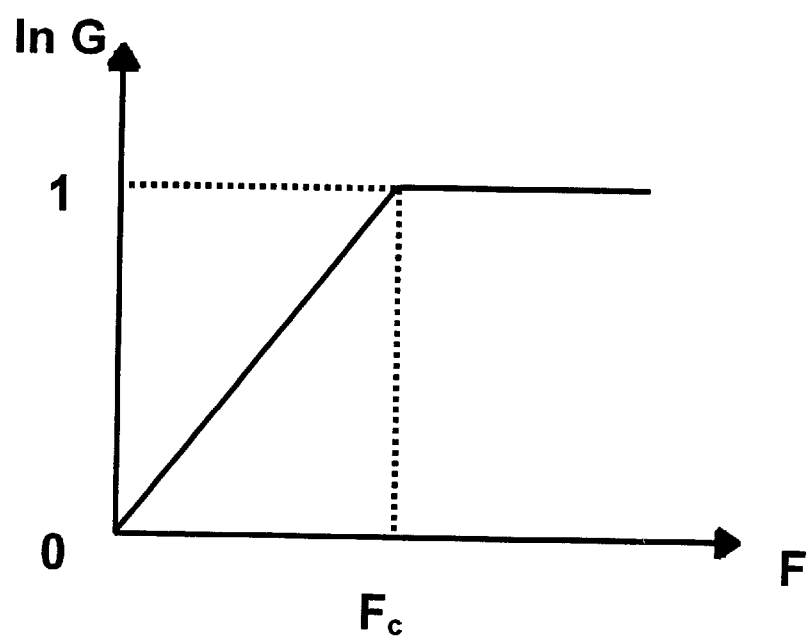
FIG. 3 represents the logarithm lnG of the transfer function of the digital high-pass filter versus the frequency F of the measured signals.

The digital processing circuit 4 performs the function of a high-pass filter whose transfer function is represented in FIG. 3, with a cutoff frequency $F_c$. The cutoff frequency $F_c$ must be higher than the offset variation frequency, which is very low, about one mHz, and much lower than the frequency (50 or 60 Hz) of the signals to be measured. In practice the cutoff frequency is comprised between 1 and 15 Hz, preferably about 4 Hz.

The digital filtering function is performed according to the equation:

$$S_i = S_{i-1} - \alpha S_{i-1} + E_i - E_{i-1} \qquad (1)$$

in which i, positive or zero, is the rank of the sample considered, $E_i$ an input sample supplied by the analog-todigital conversion circuit 3, $S_i$ an output sample from the high-pass filter, and $\alpha$ a constant, which is a function of the sampling period of the signals to be measured and of the cutoff frequency ($F_c$) of the digital filter. In a preferred embodiment the constant a is given by:

with T=sampling period and $\tau=1/(2\pi F_c)$

The values of T and $\tau$ are such that the ratio $T/\tau$ is very small compared with 1 and that $e^{-T/\tau} \sim 1 - T/\tau$. An approximation of $\alpha$ can consequently be given by $\alpha \sim T/\tau$.

Figure 2:
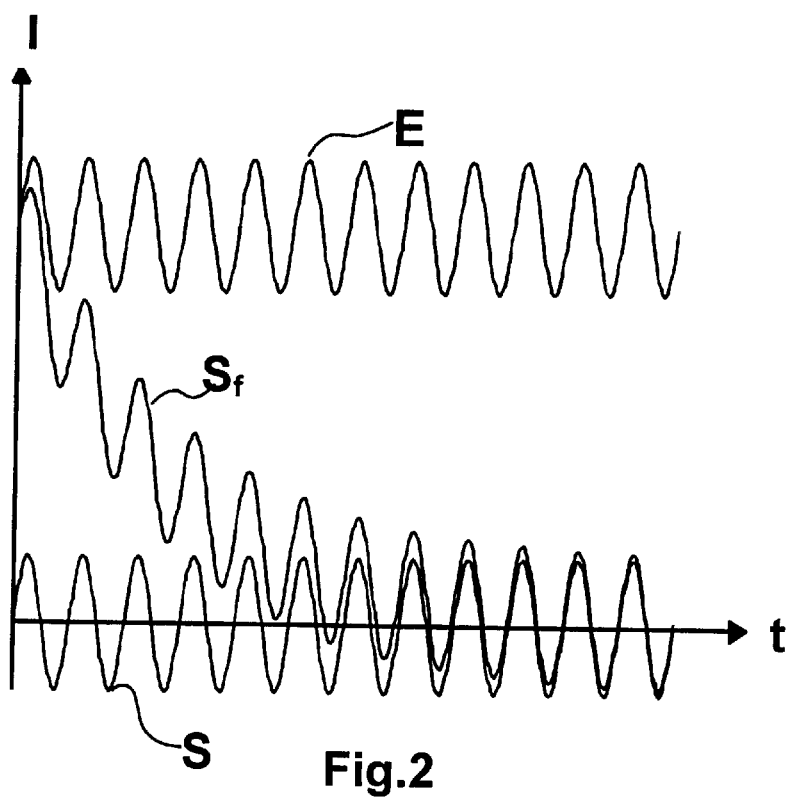
FIG. 2 illustrates the wave forms, versus time, of the input signal E of the digital processing circuit of a trip device according to FIG. 1, of the output signal $S_f$ of a high-pass filter of the digital processing circuit and of the output signal S of such a filter after initialization according to the invention.

The output signal $S_f$ from the filter thus obtained is represented in FIG. 2. It is clearly apparent from this figure that, when the trip device is powered on, a certain time is required for the offset to be cleared. The time (more than 5 periods in FIG. 2) is a function of the offset value and increases with this value. Yet the wider the current range covered by the current sensors, constituted in FIG. 1 by the current transformers 1, the more the offset increases. It is therefore desirable to take measures to eliminate this correction delay on power-up.

According to the invention, the correction delay is eliminated by initialization of the digital filter when the trip device is powered up. The initialization phase comprises zero resetting of the input of the analog-to-digital conversion circuit. As represented in FIG. 1, this is performed by the multiplexer 2, under the control of the digital processing circuit 4. The multiplexer 2 comprises 4 inputs, 2a, 2b, 2c and 2d, respectively connected to the output of an integrator of one of the 4 analog measuring channels, and an additional, grounded input 2e. It comprises a single output 2f connected to the input of the analog-to-digital conversion circuit 3. Under the control of the digital processing circuit 4 one of the inputs can be temporarily connected to the output 2f. During the initialization phase the input 2e is connected to the output 2f by means of a switch A as represented in FIG. 1. Then, in classical manner, the inputs 2a to 2d are successively and cyclically connected to the output 2f, so as to supply the circuit 4 with successive measurements of samples of the currents to be measured on the four measuring channels.

Figure 4:
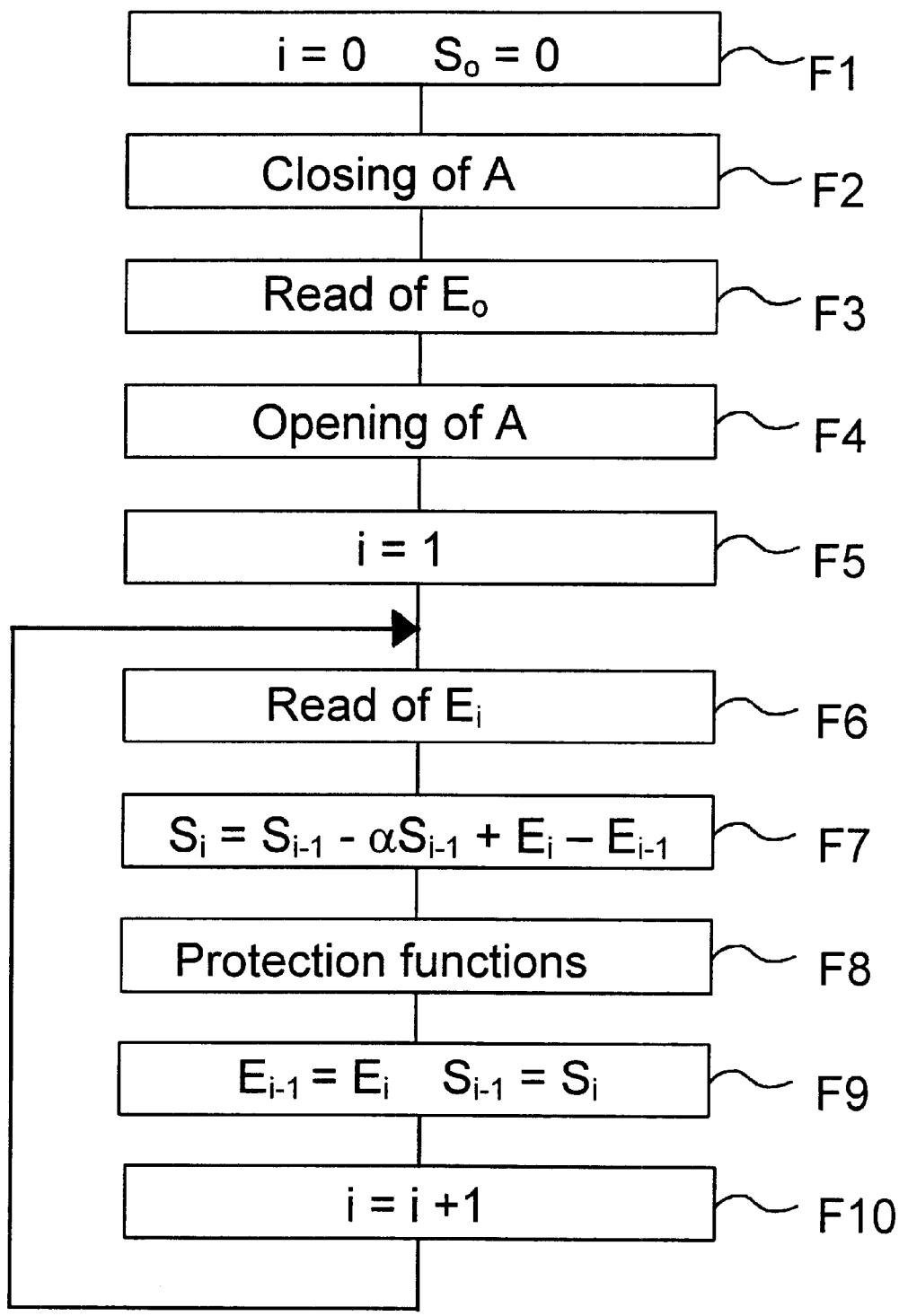
FIG. 4 represents a particular embodiment of a flowchart able to be used in a digital processing circuit according to the invention.

According to the particular embodiment of a flowchart represented in FIG. 4, the digital processing circuit 4 starts the initialization phase by a step F1 in which the rank i of the sample and the value $S_0$ of the output sample are set to 0. Then, in a step F2, the switch A is closed connecting the output 2f of the multiplexer 2 to its input 2e, i.e. grounding the input of the analog-to-digital conversion circuit 3. The converted input sample $E_0$ is read and stored during a step F3, this value corresponding to the offset value taken into account by the initialization phase. After opening of the switch A (step F4), the rank i is incremented (i=1) in a step F5, then the digital processing circuit 4, having completed its initialization phase, goes on to a processing phase of the following samples $E_i$. The steps F6 to F10 of FIG. 4 correspond to the processing phase of the successive samples of a digital channel. Processing of the other channels is performed in the same way, in parallel.

An input sample $E_i$ is read and stored (step F6). Then the corresponding output sample $S_i$ is computed according to the equation (1), in a step F7. The protection functions are then performed (step F8) in conventional manner, leading to an alarm and/or trip in case of an overload or a short-circuit. Then (step F9), the current values of the input and output samples ($E_i$ and $S_i$) are stored in memory locations corresponding to the previous samples:

$E_{i-1}=E_i$ $S_{i-1}=S_i$

The rank i is then incremented: i=i+1 (step F10). The digital processing circuit 4 then loops back to step F6 for reading the next sample.

This initialization of the digital filter enables an almost immediate correction of the offset to be achieved as soon as the trip device is powered on, as illustrated by the curve S of FIG. 2.

Figure 5:
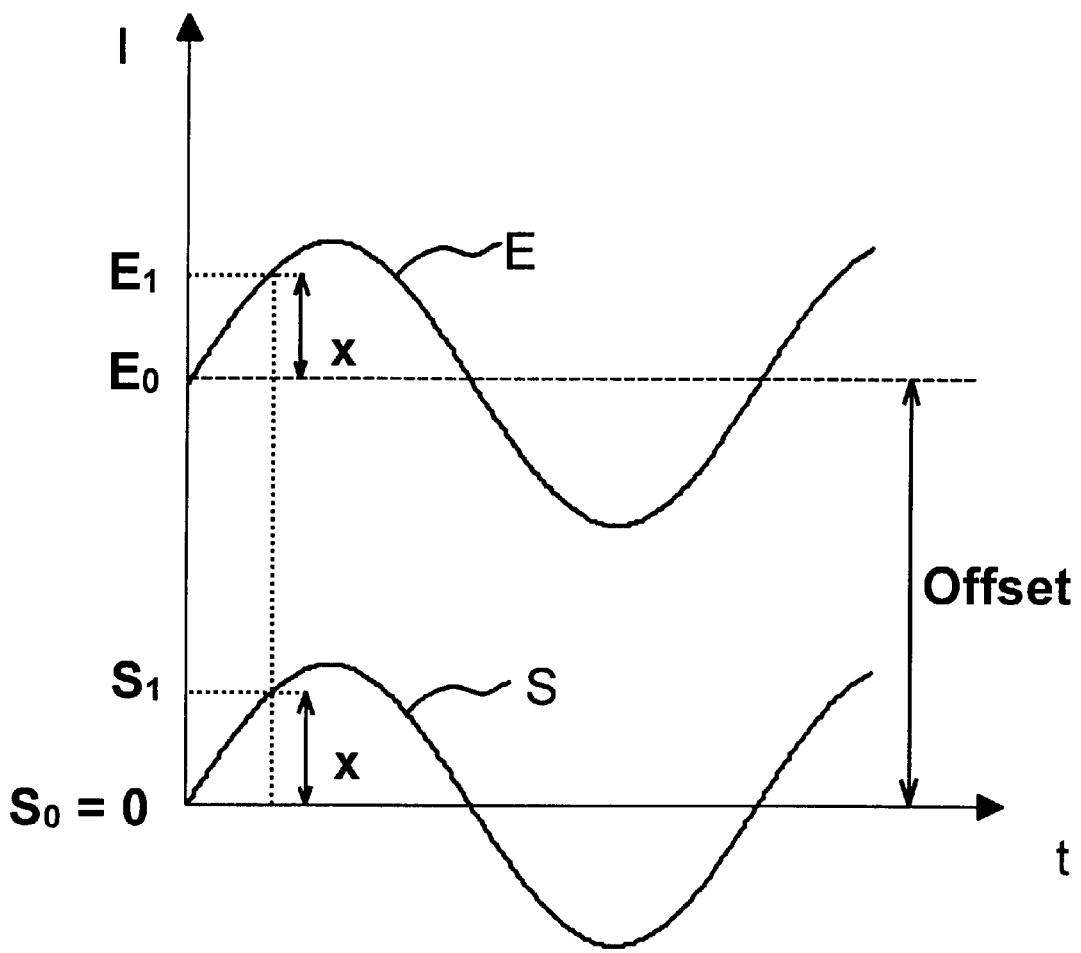

As represented in FIG. 5, for a current I to be measured presenting an offset, on initialization, the input of the circuit 3 being grounded, the value of the sample $E_0$ correspond to the offset. Setting the corresponding value $S_0$ of the output sample to zero causes an immediate offset of the curve S with respect to the curve E. Then, when the first sample $E_1$ is measured, the value $S_1$ computed according to the equation (1) is given by:

$$S_1 = S_0 - \alpha S_0 + E_1 - E_0 = E_1 - E_0 =_x$$

The curve S therefore follows the curve E exactly between the samples S0 and $S_1$, with correction of the offset. The response time of the filter is therefore very fast after the initialization phase.

The following samples $S_i$, which systematically take account of the previous input sample ($E_{i-1}$) and output sample ($S_{i-1}$), automatically enable a compensation of the subsequent, slow, variations of the offset to be made. This digital processing of the offset correction is simple and very inexpensive compared with a correction of analog type. Moreover, due to the initialization of the digital filter, the response time of the filter is very fast after the initialization phase.

In the particular embodiment represented in FIG. 1, four measuring channels are connected to a single conversion circuit 3 by means of a multiplexer 2. Initialization of the offset correction is performed once only, the same initial values $E_0$ and $S_0=0$ being used for the four measuring channels, the value $E_0$ corresponding to grounding of the output 2f of the multiplexer 2. However in practice all the measuring channels do not necessarily have the same offset, in particular due to the possible presence of protection diodes upstream from the multiplexer. It is possible on initialization to make an independent measurement of the offset for each channel by grounding not the output 2f of the multiplexer but the input of the corresponding analog channel. This however requires control not only of the multiplexer but also of switches connected upstream from the multiplexer in each measuring channel. In addition, performing four distinct offset measurements when the trip device is powered on takes time, reducing any advantage which may have been gained by initialization of the digital filter.

The offset correction described above applies in the same way to measurement of currents and of voltages.

What is claimed is:

1. An electronic trip device comprising:

analog measuring means for measuring electrical signals;

analog-to-digital conversion means having an input connected to the analog measuring means, and an output point for a first output signal;

digital processing means connected to the conversion means for performing protection functions; and offset correction means comprising:

high-pass digital filtering means connected to the output point of the conversion means for outputting a second output signal; and means for initialization of the high-pass digital filtering means during an initialization phase, grounding the input point of the conversion means, storing the first output signal from the conversion means and zero resetting the corresponding second output signal from the high-pass digital filtering means.

2. The trip device according to claim 1, wherein the digital filtering means perform computation of an output value Si for each sample Ei supplied by the conversion means, according to the equation:

$$S_i = S_{i-1} - \alpha S_{i-1} + E_i - E_{i-1}$$

wherein i corresponds to the rank of the sample considered, $\alpha$ is a constant which is a function of a sampling period of the signals to be measured and of a cutoff frequency of the digital filtering means, $S0=0$, and E0 is the value of the first output signal from the conversion means obtained when initialization is performed.

3. The trip device according to claim 1, comprising a plurality of analog measuring channels whose outputs are connected to a multiplexer, connected to conversion means common to the analog measuring channels, the digital processing means controlling the multiplexer to set the input of the conversion means to zero during the initialization phase.

* * * * *